(12) United States Patent
Stewart

(10) Patent No.: US 8,982,554 B2
(45) Date of Patent: Mar. 17, 2015

(54) AIRFLOW MANAGEMENT SYSTEM FOR CABINET HAVING FIELD REPLACEABLE UNITS

(71) Applicant: Oracle International Corporation, Redwood City, CA (US)

(72) Inventor: Thomas E. Stewart, San Diego, CA (US)

(73) Assignee: Oracle International Corporation, Redwood City, CA (US)

( * ) Notice: Subject to any disclaimer, the term of this patent is extended or adjusted under 35 U.S.C. 154(b) by 232 days.

(21) Appl. No.: 13/727,428

(22) Filed: Dec. 26, 2012

(65) Prior Publication Data

US 2014/0177164 A1 Jun. 26, 2014

(51) Int. Cl.
*H05K 7/20* (2006.01)
*H05K 13/04* (2006.01)

(52) U.S. Cl.
CPC ........ *H05K 13/0486* (2013.01); *H05K 7/20145* (2013.01); *H05K 7/20736* (2013.01)
USPC ................ 361/690; 361/679.46; 361/679.51; 361/695; 454/184; 312/223.2

(58) Field of Classification Search
USPC ................ 361/679.46–679.5, 688–697, 715, 361/724–728, 734, 736, 740, 741, 754, 796, 361/798–801, 829, 831; 165/80.3, 104.33, 165/185, 122–126; 454/184; 312/223.2, 312/223.3, 308, 310, 321.5, 351.2, 336, 312/362; 174/50, 50.52, 520, 481, 17 R
See application file for complete search history.

(56) References Cited

U.S. PATENT DOCUMENTS

| | | | | |
|---|---|---|---|---|
| 6,980,435 | B2* | 12/2005 | Shum et al. | 361/695 |
| 7,646,601 | B2* | 1/2010 | Zhang et al. | 361/695 |
| 7,843,683 | B2* | 11/2010 | Suffern et al. | 361/679.46 |
| 8,305,756 | B2* | 11/2012 | Regimbal et al. | 361/695 |
| 8,678,524 | B2* | 3/2014 | Green | 312/223.2 |
| 2005/0162831 | A1* | 7/2005 | Shum et al. | 361/695 |
| 2007/0147010 | A1* | 6/2007 | Arnel et al. | 361/727 |
| 2009/0168328 | A1* | 7/2009 | Peng et al. | 361/679.46 |
| 2010/0073868 | A1* | 3/2010 | Mayer et al. | 361/679.51 |
| 2010/0087956 | A1* | 4/2010 | Regimbal et al. | 700/276 |
| 2010/0132598 | A1* | 6/2010 | Chan et al. | 110/336 |
| 2010/0285096 | A1* | 11/2010 | Wang et al. | 424/431 |
| 2011/0053485 | A1* | 3/2011 | Huang et al. | 454/184 |

OTHER PUBLICATIONS

Rasmussen, Neil, "Improving Rack Cooling Performance Using Airflow Management Blanking Panels", White Paper #44, 2007-2008 American Power Conversion, 11 pages.

* cited by examiner

*Primary Examiner* — Michail V Datskovskiy
(74) *Attorney, Agent, or Firm* — Marsh Fischmann & Breyfogle LLP; Jonathon A. Szummy

(57) ABSTRACT

A system for use with a computing rack that prolongs operation of computing devices mounted within the rack by preventing or at least limiting the circulation of airflow (e.g., hot airflow) through empty receiving bays of the rack upon removal of computing devices from the receiving bays. In one arrangement, the system includes a plurality of airflow restriction devices (e.g., baffle plates) movably secured adjacent respective receiving bays of the cabinet. Each airflow restriction device is automatically movable between a deployed position to restrict airflow through respective receiving bay in the absence of a computing device in the receiving bay and a refracted position to allow for mounting of a computing device in the receiving bay (e.g., so that the computing device can exhaust hot air out of the rear portion of the receiving bay).

11 Claims, 13 Drawing Sheets

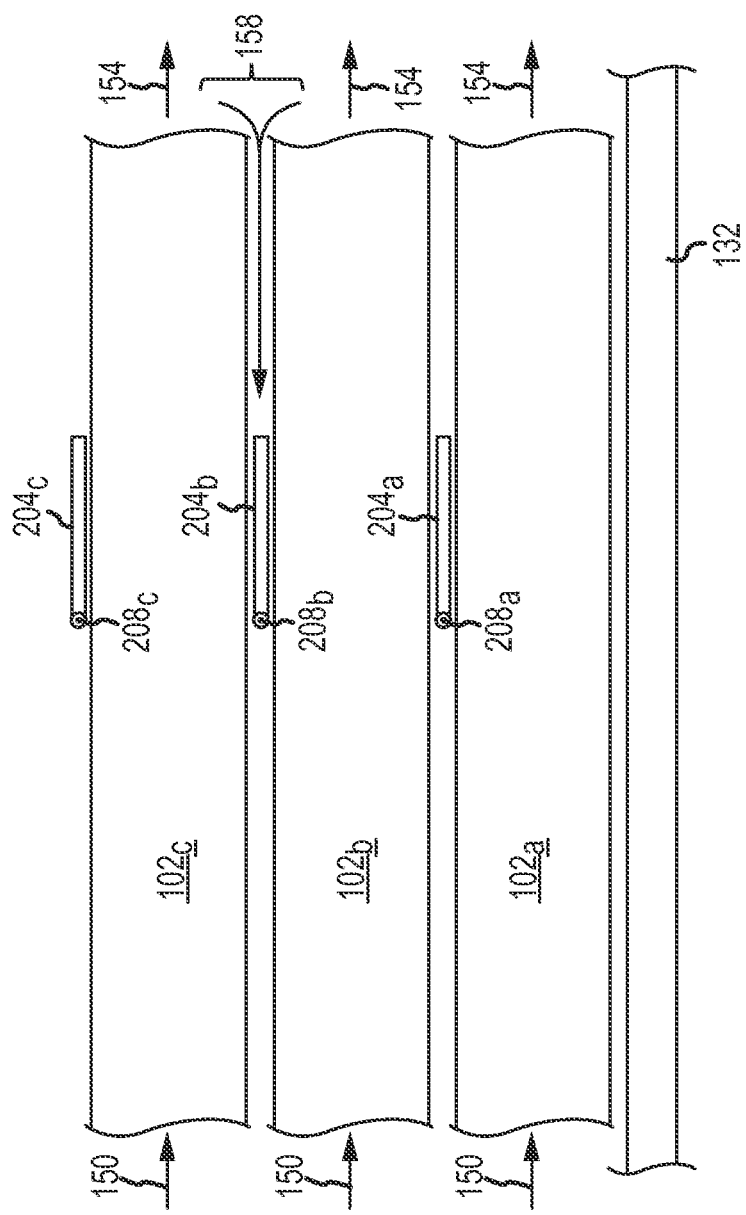

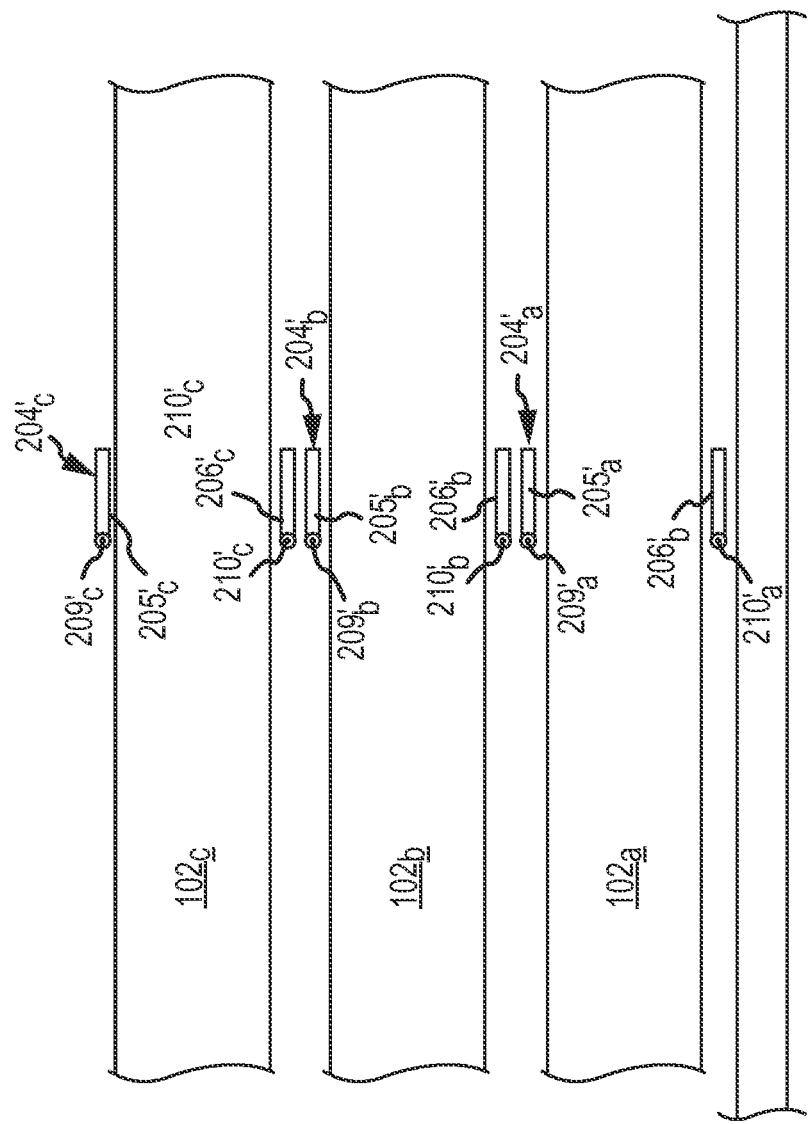

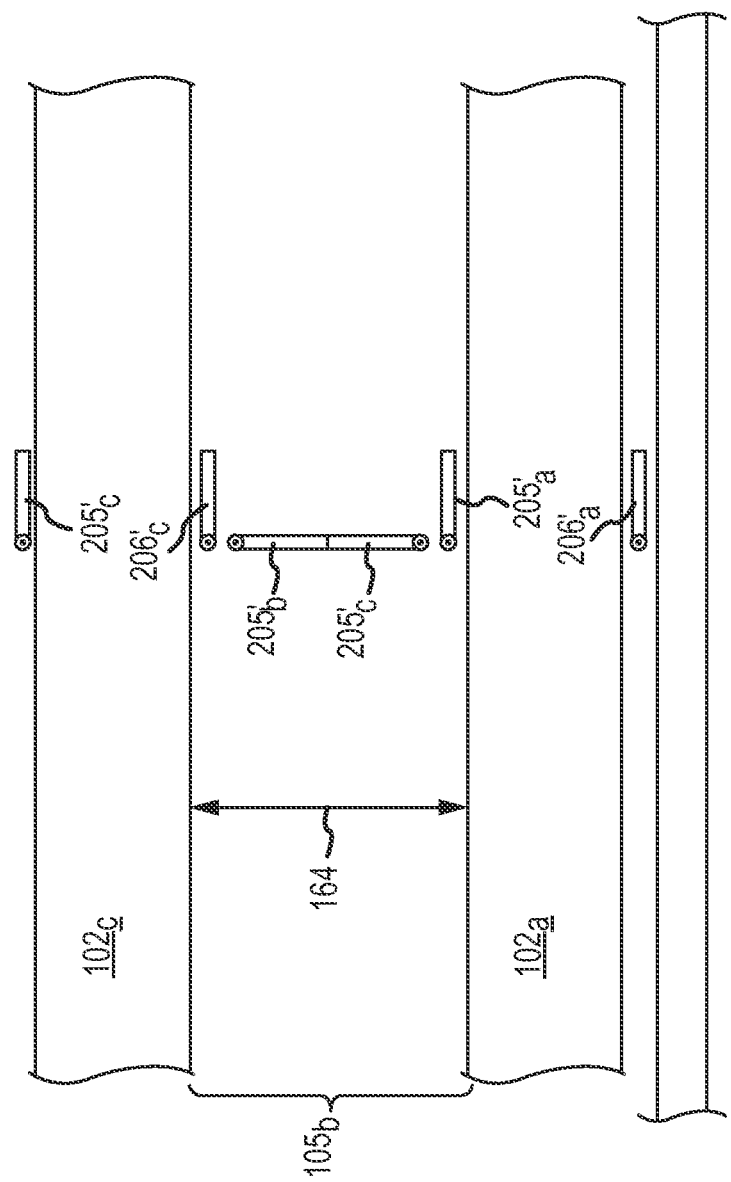

AIRFLOW MANAGEMENT SYSTEM FOR CABINET HAVING FIELD REPLACEABLE UNITS

BACKGROUND

1. Field of the Invention

The present invention generally relates to computing or storage racks (e.g., cabinets, libraries) for holding computing devices or field replaceable units (FRUs) such as servers, tape drives, other electronic equipment, and the like and, more particularly, to a system that, upon removal of a FRU from a rack, automatically limits unintended airflow (e.g., hot airflow) recirculation through the empty space or bay where the FRU was installed in the rack to thereby improve equipment reliability, simplify service of individual FRUs, and the like.

2. Relevant Background

Information technology (IT) racks are standardized frames that are designed to hold a plurality of computing devices or related equipment (e.g., rack-mounted servers, power distribution units or backup devices, hard drives, and/or other types of FRUs) in, for instance, a stacked or side by side manner. Generally, rack systems include a mechanical framework made up of a number of vertical support members (e.g., posts, Radio Electronics Television Manufacturers Association ("RETMA") rails) extending upward from a floor or other platform and defining a storage space therewithin into which FRUs may be inserted. Typically, the vertical support members define a plurality of "bays," where each bay is configured to receive a corresponding FRU. Each bay may have a standardized height in one or more multiples of a rack unit (U) to correspond with correspondingly sized FRUs. For instance, industry standard rack systems often come in heights of 18 U, 22 U, 36 U, 42 U, and the like. Also, a rack system may be in the form of a 19-inch rack (i.e., the width between the front two vertical members may be 19"), a 23-inch rack, or the like.

It is generally desirable for each FRU to be installed and/or serviced without affecting operation of the other FRUs, and, in many cases, it is desirable for each FRU to be maintained or accessed without disconnecting it from power or communications/network links (e.g., to provide hot swappable and maintainable servers in an enterprise or data center environment). To this end, each FRU may be mounted within a bay of the rack using a rail, slide or rack-mount kit. A rail kit typically includes a pair of outer rail assemblies, each of which is attached to vertical support members of the rack and extends horizontally to define a server mounting location within a bay of the rack. Each outer rail assembly may be mated or otherwise interconnected with a middle rail or middle member of the rail kit. The middle rail often will be supported within an inner channel or groove of the outer rail assembly and the middle rail may be positioned by sliding within the outer rail assembly between refracted and extended positions. In the extended position, the middle rails typically extend outward from the ends of the outer rail assemblies several inches to a foot or more to allow access to an attached or supported server or other computing device. In the refracted position, the middle rail has its outer end positioned within the outer rail.

To mount a server in the rack, a pair of inner or rack rails is attached to an outer surface of a server (or other computer device) chassis, and each of the inner or rack rails is coupled with or otherwise interconnected to a corresponding one of the middle members or rails. Generally, a server is mounted within the server storage rack by extending out the middle rail, aligning the ends of the both of the inner or rack rails on the server chassis with the ends of the middle rails, and, once proper alignment is achieved on both sides, pushing on the server chassis to cause the inner rails or racks to mate or couple with the middle members or rails (e.g., in a tongue-and-groove manner) as the inner rails slide within channels or grooves of the middle member or rails. Continued pushing then causes the middle member or rail to slide within the outer rail or member from the extended position to the retracted position, which allows any storage rack doors to be closed.

One important consideration to be taken into account when designing and arranging computing/electronic racks that store a plurality of FRUs is airflow management through the racks. Generally, a FRU mounted within a receiving bay of a rack cools itself by drawing in ambient air through an air intake adjacent the front of the FRU via a front of the receiving bay and then exhausting hot air out the back of the FRU via a rear of the receiving bay. Oftentimes, cold air (e.g., from an air conditioning system) can be exhausted from floor vents for uptake by the fronts of the mounted FRUs in an attempt to maintain proper operating temperatures of the FRUs (i.e., to reduce the likelihood of overheating and possible failure). Furthermore, rows of racks can be oriented in a "face-to-face" orientation to reduce the likelihood that the hot air exhausted from the rear of one rack is drawn in through the front of an adjacent rack (which could lead to overheating of FRUs in the adjacent rack).

Despite the above precautionary measures that aim to maintain proper FRU operating temperatures in computing racks, possibilities still exist for hot air exhausted by FRUs of a particular computing rack to be recycled/re-circulated and drawn back into the air intakes of the FRUs of the particular computer rack. For instance, one situation where such exhaust air recycling can occur is when a FRU is removed from a receiving bay of a rack or, in other words, when a particular receiving bay of a rack is empty. In this situation, hot air being exhausted out of the rear of the rack can be drawn back through the empty bay to the front of the rack and eventually into the air intakes of the FRUs that are still mounted in the rack (e.g., particularly, those FRUs adjacent the empty bay). Such air recycling can be caused by, for instance, air pressure differences between the front and rear of the rack (e.g., the high pressure exhaust air attempting to equalize with the low pressure, relatively cool inlet air). In the case of large-scale computing rack deployments (e.g., large corporations having server rooms with hundreds or even thousands of racks), the negative effects owing to such hot exhaust air recycling can be quite dramatic. For instance, the increased energy consumption by server fans attempting to cool off servers within a rack due to hot exhaust air recycling can result in substantial cost and operational issues for the operator of a compute farm or server area, especially when multiplied over hundreds or thousands of racks (some of which may be distributed around the world).

One common technique used in an attempt to counteract the above phenomenon is by mounting one or more "blanking panels" over the front of the empty receiving bays (e.g., empty vertical spaces) of the computing rack. For instance, such blanking panels can range from simple plastic or even cardboard panels that may be placed across the front of the empty bays to more sophisticated arrangements having snap-on retention mechanisms that hold the panel onto the front of the rack. Regardless of the specific design, the fundamental principle of a blanking panel is to limit the recycling of hot exhaust air from the rear of the rack through the empty bay or vertical space to the front of the rack that may otherwise be drawn in by FRUs mounted in the rack and lead to overheating of such FRUs, among other complications.

SUMMARY

The blanking panels currently used for limiting the recycling of heated exhaust air in computing/equipment racks suffer from or otherwise present a number of concerns that undermine any advantages presented by such blanking panels. In one regard, the mounting of blanking panels over the front of empty receiving bays or vertical spaces of a computing/equipment rack is an extra operation that a user must perform (and must remember to perform) in order to obtain the benefits of limiting heated exhaust air recycling through the empty bays/spaces. In another regard, each blanking panel is an extra loose piece that must be stored for future use when a FRU is mounted within the rack and that can be lost, misplaced, and the like. Furthermore, the blanking panels might not always be correctly sized and/or configured for effectively blocking the airflow through the empty bays.

In view of at least the foregoing, disclosed herein is a system for use with a computing/equipment rack that prolongs operation of computing devices mounted within the rack by automatically (i.e., substantially free of user intervention) blocking or restricting airflow (e.g., hot exhaust air) through empty receiving bays of the rack upon removal of computing devices from the receiving bays. That is, as opposed to requiring a user/technician to mount (and/or remember to mount) a blanking panel over the front of an empty receiving bay upon removal of a FRU from the rack (or when a receiving bay/vertical space in the rack is otherwise empty), the disclosed system automatically blocks airflow through empty receiving bays (e.g., upon removal of FRUs from the receiving bays) to maintain proper operating temperatures of FRUs mounted within the rack, reduce the increase in airflow (and corresponding increase in noise, fan vibrations, energy consumption, etc.) that would otherwise be generated by FRUs mounted within the rack in an attempt to compensate for the hot exhaust air circulating back through the empty receiving bay, reduce the time and effort associated with servicing FRUs, and the like.

In one aspect, the system includes a plurality of airflow restriction devices (e.g., baffle plates) movably secured adjacent respective receiving bays of the cabinet. Each airflow restriction device is automatically movable (e.g., pivotable, slidable) between a deployed position that restricts airflow through the respective receiving bay in the absence of a computing device in the receiving bay and a retracted position that allows for mounting of a computing device in the receiving bay (e.g., and that allows for airflow circulation out of the rear portion of the receiving bay). For instance, each airflow restriction device may be sized to substantially fill the interior cross-sectional area of a receiving space of a respective one of the receiving bays in the deployed position. In one embodiment, the system may include a plurality of pivot axes respectively extending along the width and/or height dimensions of the receiving spaces of the receiving bays, where each of the airflow restriction devices pivots about a respective one of the pivot axes between the deployed and retracted positions. For instance, the airflow restriction devices may be biased into the deployed position in the absence of a FRU in the respective receiving space of the receiving bay by a respective plurality of biasing or spring members.

In another aspect, a method of maintaining airflow circulation in a rack storing a plurality of FRUs in a respective plurality of receiving bays includes removing a first FRU from a receiving space of a first receiving bay of the rack via a front end of the first receiving bay; and deploying, in response to the removing step, a first airflow restriction device movably secured to the rack adjacent the first receiving bay to restrict airflow through the receiving space of the first receiving bay. In one embodiment, the method may include inserting a second FRU into a receiving space of a second receiving bay of the rack via a front end of the second receiving bay; and refracting, in response to the inserting step, a second airflow restriction device movably secured to the rack adjacent the second receiving bay to permit mounting of the second FRU in the second receiving bay. For instance, the inserting step may include contacting the second airflow restriction device with the second FRU so as to overcome a biasing force of the second airflow restriction device, overcome the force of gravity or the hot exhaust flow urging the second airflow restriction device into the deployed position, etc., and eventually facilitating refraction of the restriction device into a storage/retracted position.

Any of the embodiments, arrangements, or the like discussed herein may be used (either alone or in combination with other embodiments, arrangement, or the like) with any of the disclosed aspects. Merely introducing a feature in accordance with commonly accepted antecedent basis practice does not limit the corresponding feature to the singular. Any failure to use phrases such as "at least one" does not limit the corresponding feature to the singular. Use of the phrase "at least generally," "at least partially," "substantially" or the like in relation to a particular feature encompasses the corresponding characteristic and insubstantial variations thereof. Furthermore, a reference of a feature in conjunction with the phrase "in one embodiment" does not limit the use of the feature to a single embodiment.

In addition to the exemplary aspects and embodiments described above, further aspects and embodiments will become apparent by reference to the drawings and by study of the following descriptions.

BRIEF DESCRIPTION OF THE DRAWINGS

FIG. 4a is front elevation view of the perspective view of FIG. 3a.

FIG. 5a is a side elevation view of the perspective view of FIG. 3a.

FIG. 6a is a side elevation view similar to that in FIG. 5a, but according to another embodiment.

FIG. 6b is a side elevation view similar to that in FIG. 5b, but according to the embodiment of FIG. 6a.

FIG. 7b is a front elevation view similar to that in FIG. 4b, but according to the embodiment of FIG. 7a.

DETAILED DESCRIPTION

Disclosed herein is an airflow management subsystem for use with a computing or electronic rack that automatically (i.e., substantially free of user intervention) restricts airflow (e.g., hot exhaust air) circulation through empty receiving bays of the rack to limit overheating or malfunctioning of FRUs mounted within the rack and thereby prolongs and maintains FRU operation. Broadly, the airflow recirculation restriction subsystem includes a plurality of airflow restriction devices (e.g., baffles, plates, louvers, and/or the like) movably secured to the rack adjacent respective ones of the receiving bays. Each of the airflow restriction devices is generally movable between a deployed position that restricts airflow through a respective one of the receiving bays between opposed front and rear portions of the receiving bay in the absence of a computing device within the receiving bay and a retracted position that permits mounting of a FRU in the receiving bay so that airflow may be directed out of the rear portion of the receiving bay. The disclosed system advantageously maintains proper operating temperatures of FRUs mounted with a rack, reduces the time and effort associated with servicing FRUs, and the like.

Figure 1:
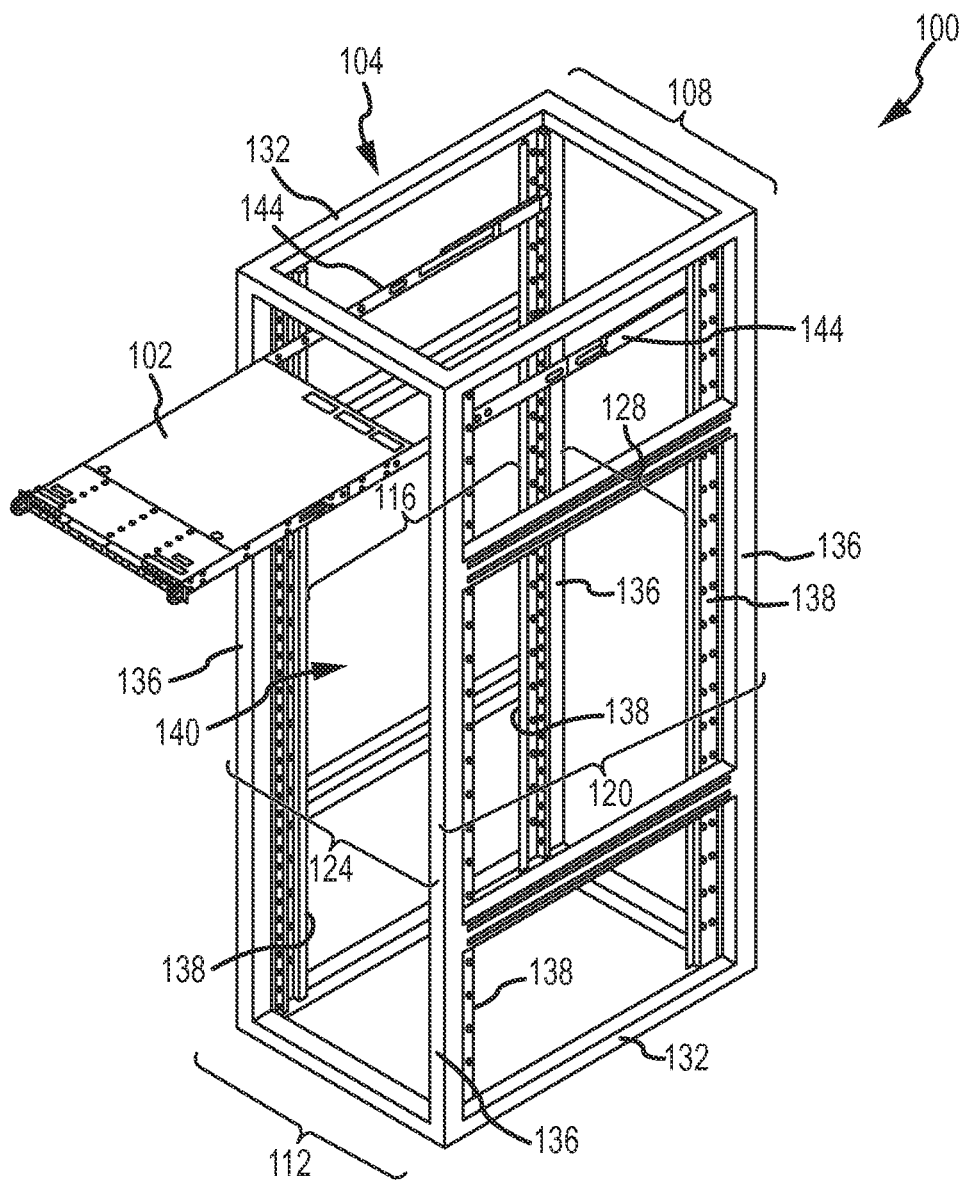
FIG. 1 is a perspective view of a storage rack according to one embodiment.

FIG. 1 is a perspective view of one embodiment of a storage rack 100 (e.g., cabinet) operable to store one or more FRUs 102 (e.g., servers, hard disk drives, and/or other electronic devices) in a stacked or side by side manner. Broadly, the rack 100 may include a framework 104 generally including a top portion 108, a bottom portion 112, and a plurality of side portions extending between the top and bottom portions 108, 112 such as a first (e.g., front) side portion 124, second (e.g., rear) side portion 128, third (e.g., left) side portion 116, and fourth (e.g., right) side portion 120. Each of the top and bottom portions 108, 112 may include a plurality of horizontal support members 132 while each of the side portions 124, 128, 116, 120 may include a plurality of vertical support members 136 extending upwardly from a floor or platform (not shown).

The various portions of the framework 104 collectively define a storage space 140 within the framework 104 for receiving a plurality of FRUs 102 therein, where the storage space 140 has a top portion (not labeled) generally coincident with the top portion 108 of the framework 104 and a bottom portion (not labeled) generally coincident with the bottom portion 112 of the framework 104. As shown, each vertical support member 136 may include or at least be associated with (or in some arrangements be in the form of) a respective perforated vertical rail 138 (e.g., a vertical RETMA rail), where the plurality of vertical support members 136 and rails 138 may collectively serve to define a plurality of receiving bays (not labeled) arranged in a vertically stacked manner between the top and bottom portions 108, 112 of the framework 104.

Each receiving bay may include a respective pair of rail assemblies 144 (only one shown in FIG. 1) for slidably receiving a respective FRU 102 in the storage space 140. For instance, each pair of rail assemblies 144 may allow a respective FRU 102 to slidably translate between an expanded position via the first/front side portion 124 of the framework (e.g., as shown in FIG. 1) and a retracted/storage position within the storage space 140 underneath the top portion 108 of the framework 140. Furthermore, each receiving bay may have a standardized height in multiples of one rack unit (U) to correspond with correspondingly sized FRUs 102. For instance, the framework 104 may have any appropriate height such as 18 U, 22 U, 36 U, 42 U, and the like, and any appropriate width such as 19 inches, 23 inches, and/or the like. Also, the openings (not labeled) disposed between the various horizontal and vertical support members 132, 136 may be covered by any appropriate paneling and/or the like (e.g., panels, windows, access doors) including any number of openings, slots, and/or the like therethrough (e.g., for ventilation to reduce operating temperatures of the computing devices, for wiring purposes, etc.). Although the rack 100 has been depicted as a box-like structure, this is not intended to be a limitation on the present disclosure. For instance, an open shelving style system could also be constructed, additional side panels could be installed so that multiple sub-boxes exist within a larger box, and/or the like. Furthermore, the various components of the rack 100 may be formed of metal, plastic, and/or the like.

Figure 2A:
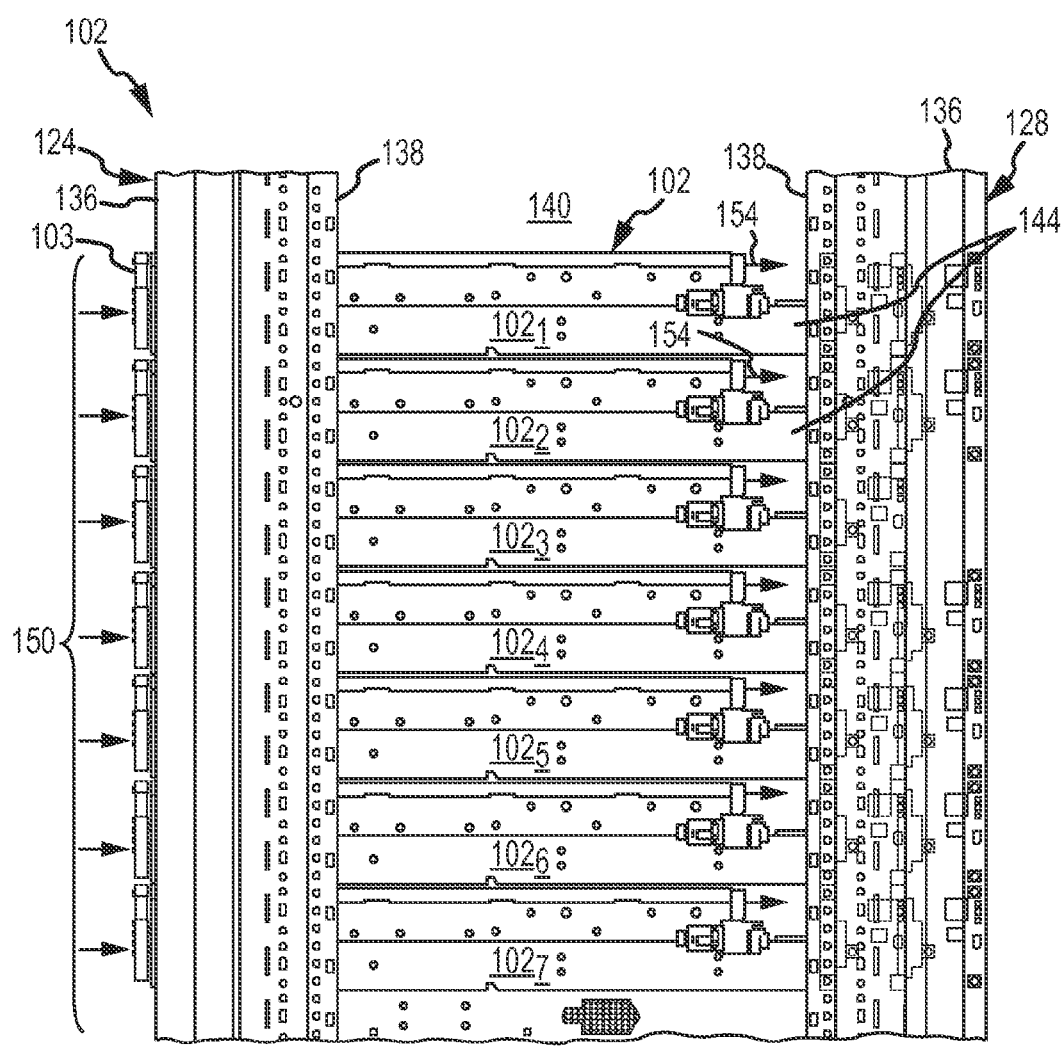
FIG. 2a is a side elevation view of the storage rack including a plurality of FRUs stacked therein and illustrating a normal airflow path through the rack.

As discussed previously, proper management of airflow through a computing rack is an important consideration to be taken into account when designing and arranging computing/electronic racks storing a plurality of FRUs (e.g., so as to avoid FRU overheating and associated degradations in FRU performance). Turning now to FIG. 2a, a side elevation view of a portion of the rack 100 including a plurality of FRUs 102 (e.g., FRUs $102_1$, $102_2$, $102_3$, $102_4$, $102_5$, $102_6$, $102_7$) stacked within a plurality of respective receiving bays (not labeled) within the storage space 140 of the rack 100 is shown. Each FRU 102 may be inserted into a receiving space of a respective receiving bay via a front portion of the receiving bay adjacent the first side portion 124 of the framework 104 towards a rear portion of the receiving bay adjacent the second side portion 128 of the framework 104. Each receiving bay is at least partially defined by a respective pair of rail assemblies 144. Generally, each of the FRUs 102 cools itself by drawing in ambient air 150 through an air intake (not shown) adjacent the front 103 of the FRU via the front portion of the receiving bay and then exhausting hot exhaust air 154 out the back (not labeled) of the FRU 102 via the rear portion of the receiving bay. While not shown, the hot exhaust air 154 may then be drawn away from the rack 100 by an air conditioning system and/or the like.

Figure 2B:
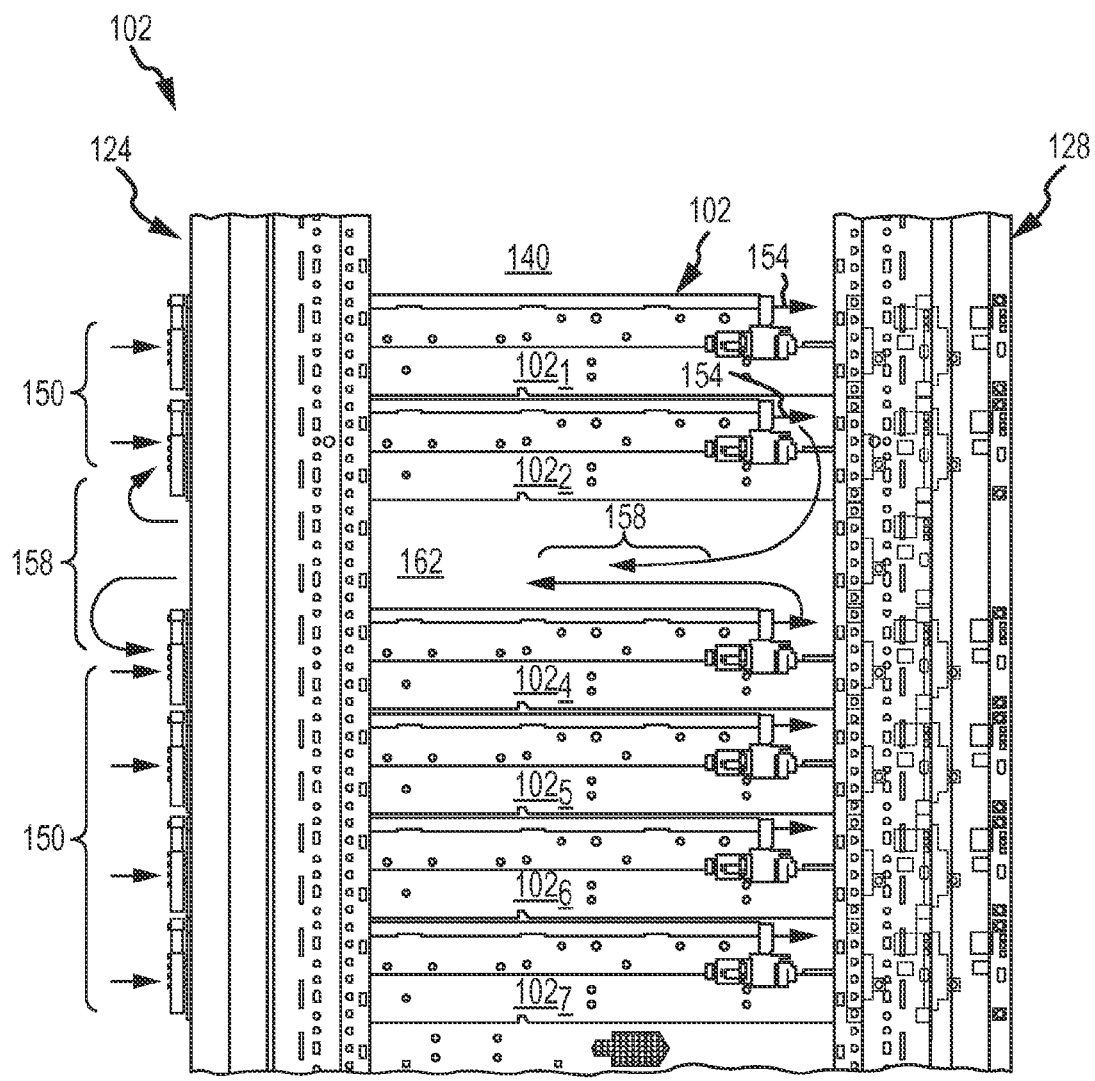
FIG. 2b is a side elevation view similar to FIG. 2a, but illustrating exhaust air recirculation back through the rack upon removal of one of the FRUs from the rack in the absence of the airflow restriction system disclosed herein.

Turning now to FIG. 2b, another side elevation view of the rack 100 similar to that in FIG. 2a is presented but after a FRU 102 (e.g., FRU $102_3$) has been removed from its receiving bay in the rack 100 via the front portion of the receiving bay adjacent the first (e.g., front) side portion 124 of the framework 104. As shown, an empty space 162 within the receiving bay extending between the first side (e.g., front) portion 124 and second side (e.g., rear) portion 128 of the framework 104 of the rack 100 exists after removal of the FRU $102_3$. As a result, at least a portion 158 of the hot exhaust air 154 exiting the FRUs 102 (e.g., from FRUs $102_2$ and $102_4$) has been redirected (e.g., via pressure differences between the high pressure, hot exhaust air 158 and the low pressure, cooler ambient air 150) from the rear portion of the receiving bay adjacent the second side portion 128 back through the empty space 162 towards the front portion of the receiving bay adjacent the first side portion 124 and eventually into the air intake of one or more of the FRUs 102 (e.g., into the air intakes of FRUs $102_2$ and $102_4$). Drawing such hot exhaust air into the air intakes of the FRUs 102 in this manner can lead to overheating of the FRUs 102 still mounted in the rack 100 and eventual reduction in FRU performance. While not shown, doors, panels and/or the like mounted over the first and second side portions 124, 128 of the framework 104 can often increase the difficulties in maintaining proper FRU operating temperatures upon removal of a FRU from a receiving bay.

For instance, the area within the framework 104 between a door mounted over the first side portion 124 and the inlets of the FRUs could become highly pressurized (e.g., in relation to the air just outside of the door) such that only minimal levels of cooling air would be able to pass through perforations of the door and into the FRU inlets. Although blanking panels are sometimes used in an attempt to limit hot exhaust air recycling through empty bays in computing racks, the use of blanking panels suffers from a number of inefficiencies such as technicians having to remember to install the blanking panels, the blanking panels not always being correctly sized to cover a particular bay, and the like.

Turning now to FIGS. 3a-5b, an airflow management system 200 for use with a computing/electronic rack is presented. Broadly, the system 200 automatically limits or restricts the movement of airflow (e.g., hot exhaust air from FRUs mounted within the rack) through empty receiving bays within the rack from a rear of the rack to the front of the rack (where such airflow would, in the absence of system 200, otherwise be drawn in by the air intakes of mounted FRUs). For purposes of facilitating the reader's understanding of the inventive aspects of the disclosed system 200, the system 200 is shown secured adjacent a portion of the rack 100, where the rack 100 includes a plurality of FRUs $102_a$, $102_b$, $102_c$ mounted within respective receiving bays $105_a$, $105_b$, $105_c$ of the storage space 140 of the rack 100. Each of the receiving bays $105_a$, $105_b$, $105_c$ may generally include a front portion adjacent the first side (front) portion 124 of the framework 104 of the rack 100, a rear portion adjacent the second side (rear) portion 128, and a receiving space between the front and rear portions (and generally bound by FRUs mounted within adjacent receiving bays). While not shown in the interest of clarity, each of the receiving bays $105_a$, $105_b$, $105_c$ may be at least partially defined by or otherwise include a pair of rail assemblies (e.g., rail assemblies 144 in FIG. 1) for facilitating insertion and removal of the FRUs $102_a$, $102_b$, $102_c$ into and from the receiving bays $105_a$, $105_b$, $105_c$, where each rail assembly may be secured to and extend between the first and second side portions 124, 128 (and be respectively parallel to the third side (left) and fourth side (right) portions 116, 120). Additionally, while only shown in conjunction with three receiving bays adjacent a bottom of the rack 100, it is to be understood that the system 200 may actually be used in conjunction with most or all of the receiving bays of the rack 100 (e.g., with more than three) between the top and bottom portions 108, 112 of the rack 100.

Figure 3A:
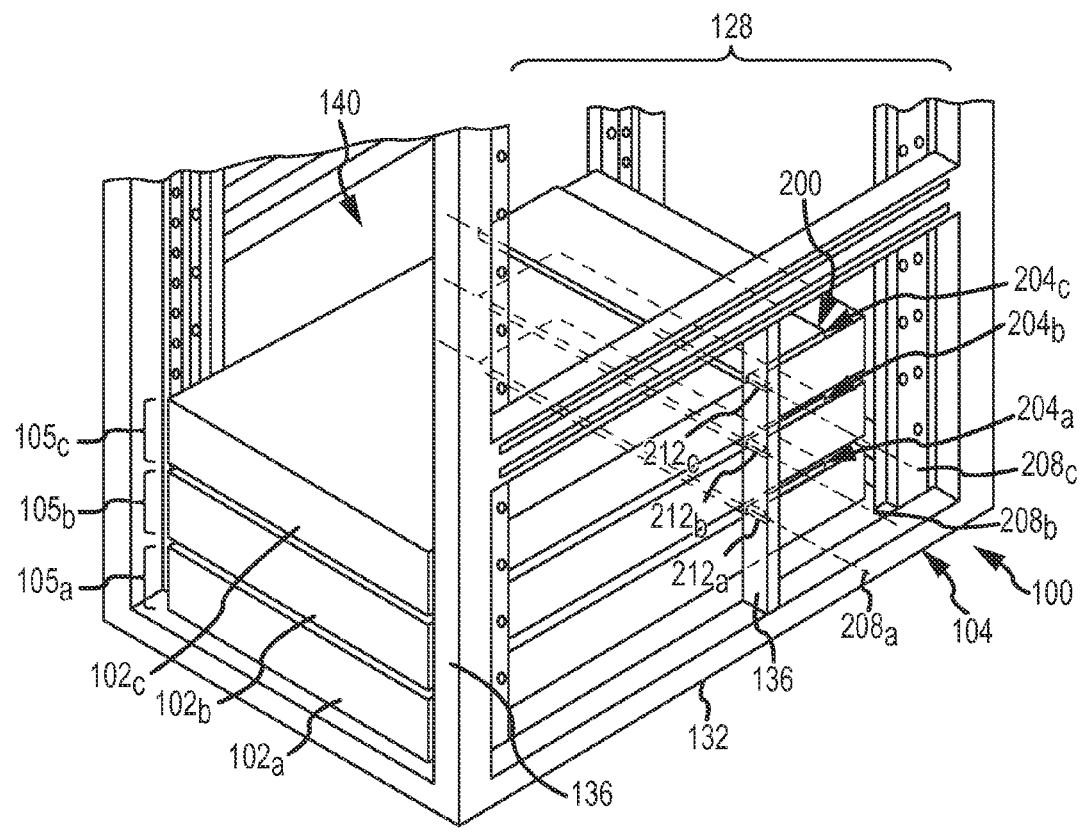
FIG. 3a is a perspective view of a portion of a computing rack incorporating an airflow management system according to one embodiment, and showing a plurality of airflow restriction devices of the system being in refracted positions within receiving bays of the rack and with FRUs being installed in the receiving bays.
Figure 3B:
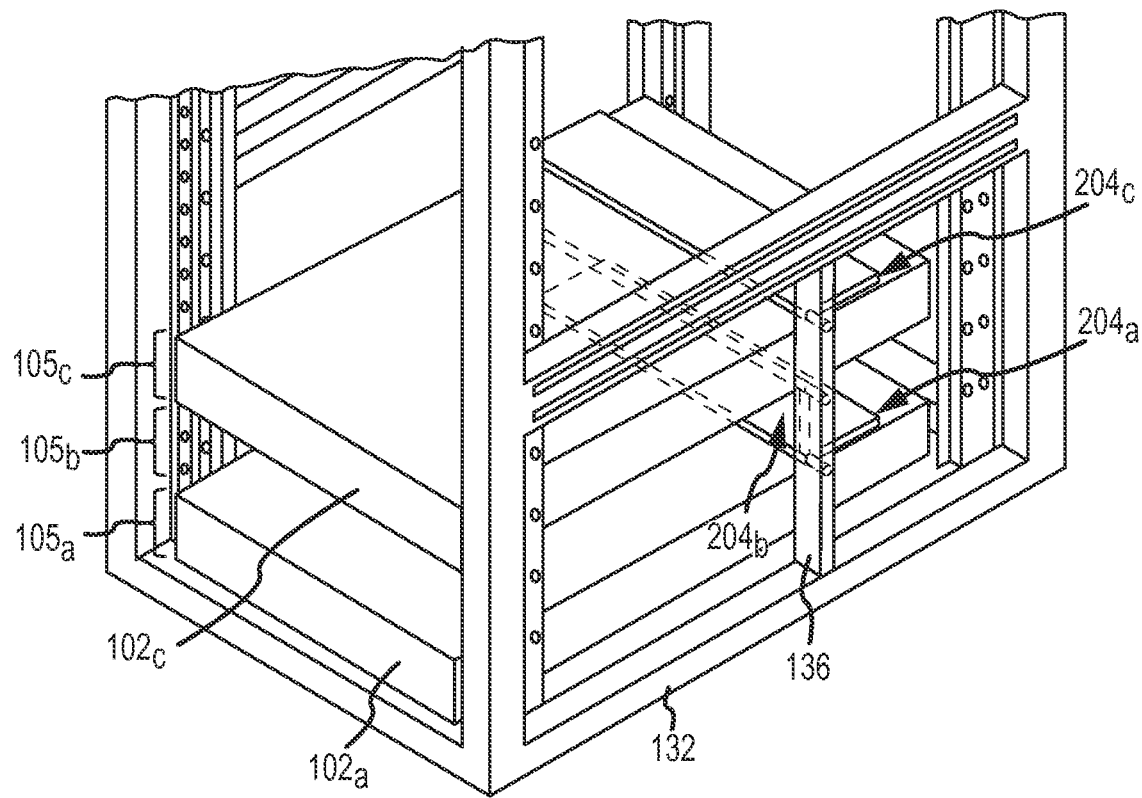
FIG. 3b is a perspective view similar to that in FIG. 3a, but showing one of the airflow restriction devices being in a deployed position.
Figure 4A:
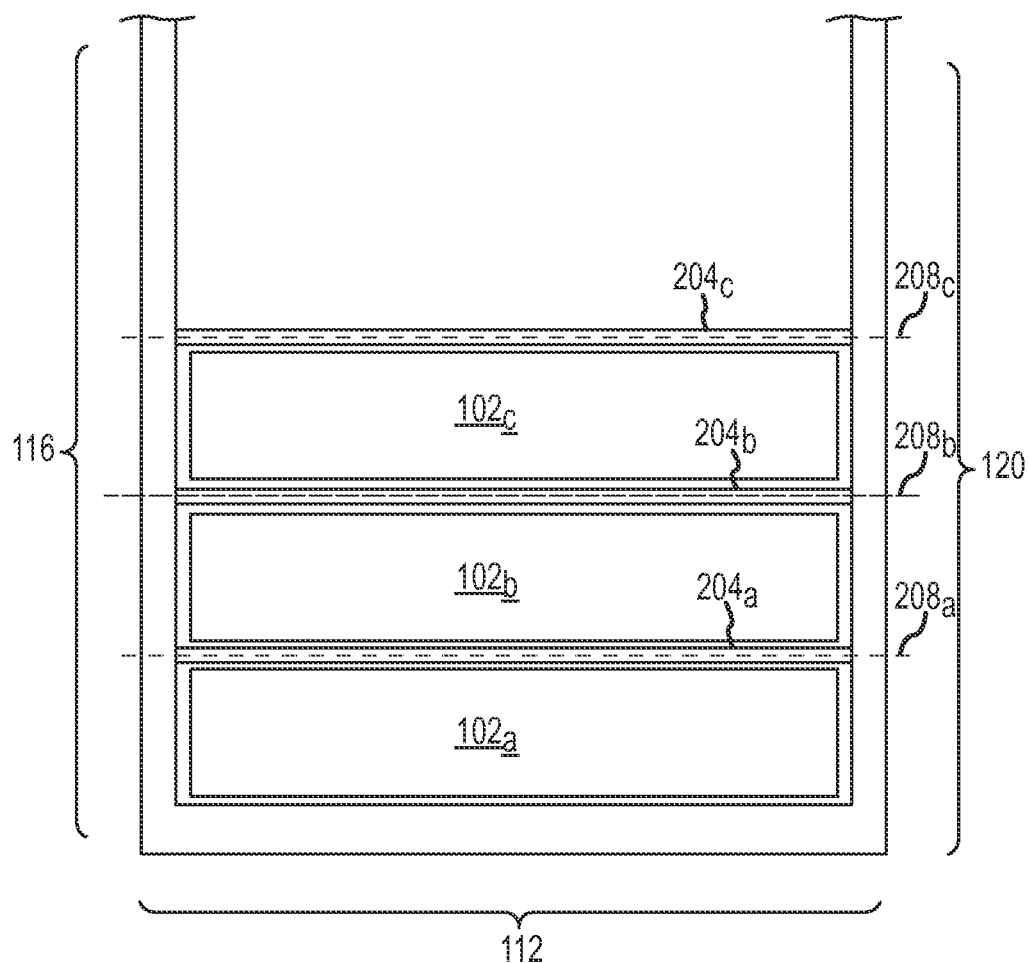

The system 200 includes a plurality of automatically deployable airflow restriction devices 204 (e.g., plates, baffles, shields, doors, louvers, etc.) for restricting airflow through empty receiving bays 105 of the rack 100, where each of the receiving bays $105_a$, $105_b$, $105_c$ includes or is otherwise associated with at least one airflow restriction device 204 (such as airflow restriction devices $204_a$, $204_b$, $204_c$). Generally, each of the airflow restriction devices $204_a$, $204_b$, $204_c$ may be moveable in any appropriate manner between at least a retracted/storage position (e.g., as shown in FIGS. 3a, 4a, 5a) that allows for receipt of a respective one of the FRUs $102_a$, $102_b$, $102_c$ and permits airflow (e.g., hot exhaust air from the FRUs $102_a$, $102_b$, $102_c$) out of the receiving spaces via the rear portions of the receiving bays $105_a$, $105_b$, $105_c$, and a deployed position in the absence of the FRUs $102_a$, $102_b$, $102_c$ therein (e.g., see airflow restriction device $204_b$ in FIGS. 3b, 4b, 5b) that restricts (e.g., blocks, limits, etc.) airflow (e.g., hot exhaust air from the FRUs $102_a$, $102_c$) through the receiving spaces of the receiving bays $105_a$, $105_b$, $105_c$ that would otherwise travel to the front portion of the receiving bays $105_a$, $105_b$, $105_c$ for uptake by FRUs 102 still mounted within the rack 100 (e.g., by FRUs $102_a$, $102_c$).

In one embodiment, each of the airflow restriction devices $204_a$, $204_b$, $204_c$ may be operable to swing or pivot about respective pivot axes $208_a$, $208_b$, $208_c$ between at least the retracted and deployed positions, where the pivot axes $208_a$, $208_b$, $208_c$ extend between the third and fourth side portions 116, 120 of the framework 104. For instance, the system 200 may include a plurality of pivoting devices $212_a$, $212_b$, $212_c$ attached in any appropriate manner to vertical support members 136 of the third and fourth side portions 116, 120 that define and facilitate pivoting of the airflow restriction devices $204_a$, $204_b$, $204_c$ about the pivot axes $208_a$, $208_b$, $208_c$. In one arrangement, each of the pivoting devices $212_a$, $212_b$, $212_c$ may be in the form of a single pivot pin appropriately secured between the third and fourth side portions 116, 120. In this regard, each of the airflow restriction devices $204_a$, $204_b$, $204_c$ may include an elongated slot or aperture through which the pivot pin extends to allow for pivoting of the airflow restriction devices $204_a$, $204_b$, $204_c$ about the respective pivot pins. In another arrangement, each of the pivoting devices $212_a$, $212_b$, $212_c$ may be in the form of a pair of opposing projections integrally formed with the airflow restriction devices $204_a$, $204_b$, $204_c$ and that are rotatably secured within respective pairs of apertures (not labeled) within vertical support members 136 of the third and fourth side portions 116, 120. Various other arrangements for facilitating pivoting of the airflow restriction devices $204_a$, $204_b$, $204_c$ between the retracted and deployed positions are envisioned and encompassed within the scope of the present disclosure.

In one variation, the system 200 may include a plurality of biasing members (not shown) that respectively bias or urge the airflow restriction devices $204_a$, $204_b$, $204_c$ into the deployed positions. That is, in the absence of a FRU $102_a$, $102_b$, $102_c$ within a respective one of the receiving bays $105_a$, $105_b$, $105_c$ a biasing member urges the corresponding airflow restriction device $204_a$, $204_b$, $204_c$ into the deployed position. For instance, the biasing members may be in the form of torsion springs that are respectively secured about the pivoting devices $212_a$, $212_b$, $212_c$ and that impart biasing forces against the airflow restriction devices $204_a$, $204_b$, $204_c$ to urge the same into the deployed positions in the absence of FRUs $102_a$, $102_b$, $102_c$ within the receiving bays $105_a$, $105_b$, $105_c$ (i.e., when the receiving bays $105_a$, $105_b$, $105_c$ are empty). Other types of biasing members are also envisioned such as coil springs and/or the like. In some variations, the system 200 may utilize the force of gravity to urge the airflow restriction devices $204_a$, $204_b$, $204_c$ into the deployed positions.

In one arrangement, each of the airflow restriction devices $204_a$, $204_b$, $204_c$ may be arranged to swing in a general direction of the hot exhaust air (e.g., airflow 158 in FIG. 2b) during movement into the deployed position to utilize the force of the hot exhaust air against the airflow restriction devices $204_a$, $204_b$, $204_c$ to maintain the airflow restriction devices $204_a$, $204_b$, $204_c$ in the deployed position (e.g., until subsequent insertion of a FRU into the respective receiving bays $105_a$, $105_b$, $105_c$). In another arrangement, one or more stop members (e.g., tabs, protrusions, etc., not shown) may be appropriately mounted within each of the receiving bays $105_a$, $105_b$, $105_c$ to limit each of the airflow restriction devices $204_a$, $204_b$, $204_c$ from swinging past a substantially fully closed or deployed position (e.g., past the position of airflow restriction device $204_b$ in FIG. 5b in a clockwise direction). In this regard, any or all of the biasing members, gravity, or hot exhaust air would serve to urge the airflow restriction devices $204_a$, $204_b$, $204_c$ against such stop members to substantially secure the airflow restriction devices $204_a$, $204_b$, $204_c$ in the deployed position.

In use, imagine that the rack 100 has the system 200 disposed therein and that the FRUs $102_a$, $102_b$, $102_c$ are respectively mounted within their respective receiving bays $105_a$, $105_b$, $105_c$ in the rack 100. See FIGS. 3a, 4a, 5a. As shown, each of the airflow restriction devices $204_a$, $204_b$, $204_c$ is in its retracted position (e.g., parallel to and above its respective FRU $102_a$, $102_b$, $102_c$) that that allows for receipt of its respective FRUs $102_a$, $102_b$, $102_c$ and that permits airflow (e.g., hot exhaust air from its respective FRU $102_a$, $102_b$, $102_c$) out of the receiving space via the rear portion of its respective receiving bay $105_a$, $105_b$, $105_c$. In the event that exhaust air attempts to flow between adjacent FRUs 102 mounted within the rack (e.g., between FRUs $102_b$, $102_c$) from the rear of the rack 100 (e.g., adjacent second side portion 128) towards the front of the rack 100 (e.g., adjacent first side portion 124), the airflow restriction device 204 disposed between the two adjacent mounted FRUs 102 (e.g., airflow restriction device $204_b$) serves to at least partially block such airflow while in the retracted position. See FIG. 5a.

In any case, assume now that FRU $102_b$ is removed from the receiving space of its respective receiving bay $105_b$ via the front portion of the receiving bay $105_b$ (e.g., for service, replacement, and/or the like). In the absence of the system 100, hot exhaust air exiting the rear of the FRUs 102 still mounted within the rack 100 (e.g., FRUs $102_a$, $102_c$) would flow into the now empty receiving space of the receiving bay $105_b$ from the rear towards the front of the receiving bay $105_b$ and eventually into the air intakes adjacent the front of the FRUs $102_a$, $102_c$, thus possibly leading to overheating of the FRUs $102_a$, $102_c$. Even in the case of blanking panels, technicians must remember to utilize the blanking panels, the blanking panels may not be correctly sized to block airflow through the empty receiving bay, the blanking panels may not remain secured over the empty receiving bay, and/or the like.

In this regard, the airflow restriction device $204_b$ of the receiving bay $105_b$, upon removal of the FRU $102_b$ from the receiving bay $105_b$, automatically (i.e., without user intervention) moves (e.g., pivots, swings) into the deployed position to substantially block or limit airflow through the receiving space of the receiving bay $105_b$ and out of the front portion of the receiving bay $105_b$ (e.g., such as at least a portion 158 of hot exhaust air 154 through the receiving space of the receiving bay $105_b$ from the rear of FRUs $102_a$, $102_c$ in a direction towards the front of $102_a$, $102_c$). See FIGS. 3b, 4b, 5b. That is, in the absence of the restoring force formerly provided by the top of the FRU $102_b$ against the airflow restriction device $204_b$, the airflow restriction device $204_b$ automatically moves away from the rear portion of the receiving bay $105_b$ towards the front portion of the receiving bay $105_b$ into the deployed position (e.g., via one or more biasing members or via gravity) to block unintended airflow through the receiving space of the receiving bay $105_b$.

Figure 4B:
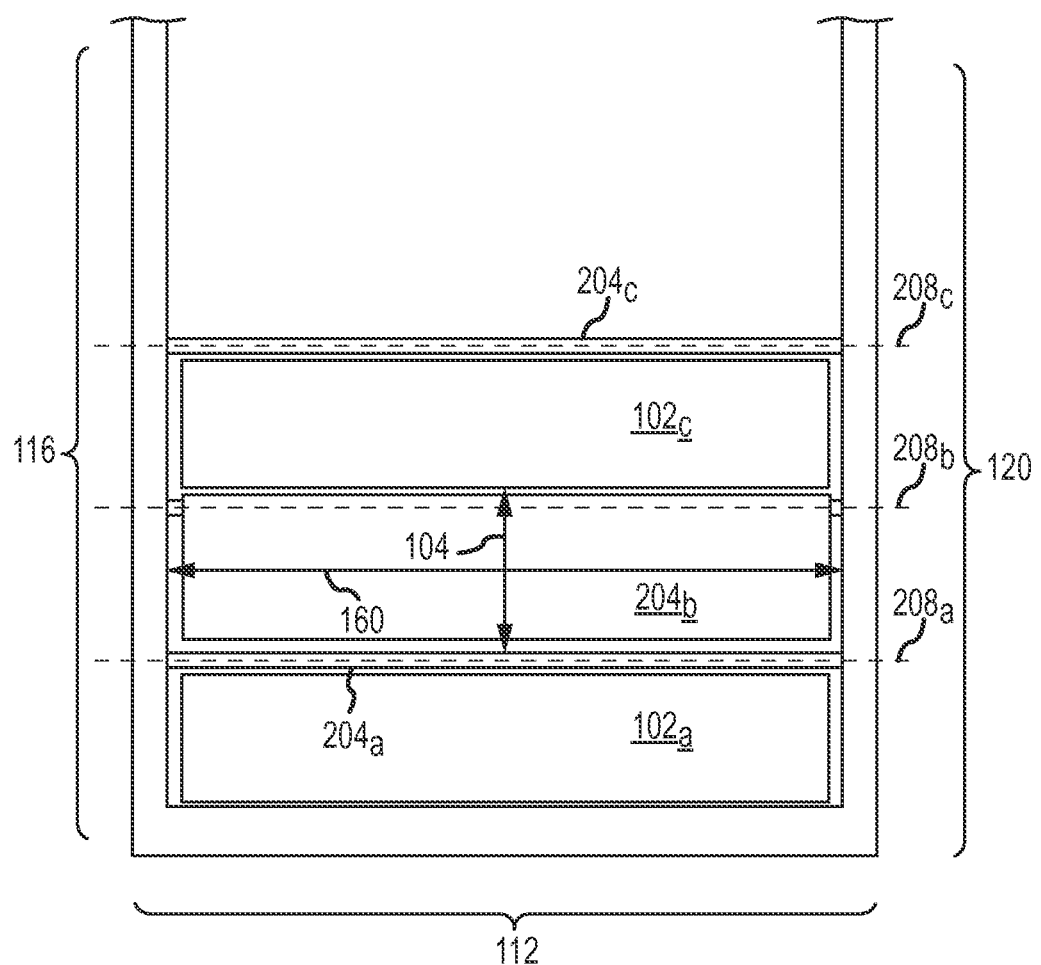
FIG. 4b is front elevation view of the perspective view of FIG. 3b.
Figure 5B:
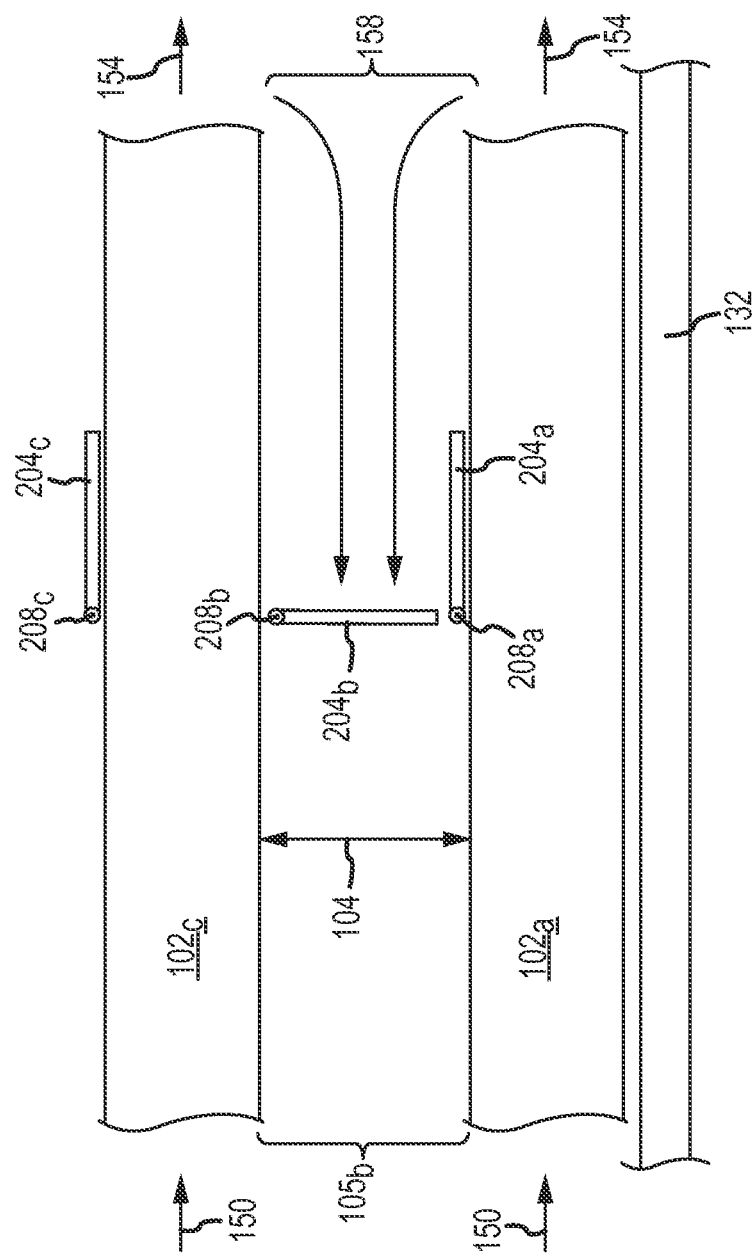
FIG. 5b is side elevation view of the perspective view of FIG. 3b.

With reference to FIGS. 4b and 5b, for instance, the airflow restriction device $204_b$ may be sized to substantially fill an interior cross-sectional area of the receiving space of the receiving bay $105_b$ defined by or otherwise including a width dimension 160 extending between the third and fourth side portions 116, 120 of the framework 140 and a height dimension 164 generally perpendicular to the width dimension 160 and extending between adjacent bays $105_a$, $105_c$. Upon reinsertion of the FRU $102_b$ (or a different FRU) into the receiving space of the receiving bay $105_b$ via the front portion of the receiving bay $105_b$, continued urging of the FRU $102_b$ against the deployed airflow restriction device $204_b$ (e.g., via contact between a rear portion or protruding bracket of the FRU $102_b$ and a front face of the airflow restriction device $204_b$) with a force greater than that provided by the biasing member or gravity causes pivoting of the airflow restriction device $204_b$ about pivot axis $208_b$ back into the retracted position. See FIG. 3a, 4a, 5a. While not discussed in use, the airflow restriction devices $204_a$, $204_c$ (and other airflow restriction devices in the rack 100) may function in a manner similar to that of airflow restriction device $204_b$. In this regard, the various airflow restriction devices 204 may independently move between the retracted and deployed positions upon insertion and removal of FRUs 102 into and from the rack 100.

FIG. 6a illustrates a side elevation view similar to that in FIG. 5a, but according to another embodiment of the system 200. In this embodiment, each of the airflow restriction devices $204_a'$, $204_b'$, $204_c'$ includes an opposing pair of airflow restriction members $205_a'/206_a'$, $205_b'/206_b'$, $205_c'/206_c'$ respectively disposed on top and bottom portions of the receiving bays $105_a$, $105_b$, $105_c$ and that are generally configured to move in vertical directions towards and away from each other between retracted and deployed positions within the receiving space of the receiving bays $105_a$, $105_b$, $105_c$. Similar to the airflow restriction devices $204_a$, $204_b$, $204_c$, the pairs of airflow restriction members $205_a'/206_a'$, $205_b'/206_b'$, $205_c'/206_c'$ may be pivotable about respective pivot axes $209_a'/210_a'$, $209_b'/210_b'$, $209_c'/210_c'$ extending between the third and fourth side portions 116, 120 of the framework 140 (e.g., and which may be defined by respective pivot members similar to those discussed previously, not shown) between refracted and deployed positions. As shown in FIG. 6a, each of the pairs of airflow restriction members $205_a'/206_a'$, $205_b'/206_b'$, $205_c'/206_c'$ may be disposed adjacent top and bottom portions of the FRUs $102_a$, $102_b$, $102_c$ when in the retracted positions. Upon removal of one of the FRUs such as FRU $102_b$ from the receiving space of its receiving bay $105_b$, a biasing force provided by a biasing member (e.g., a torsion spring similar to those discussed previously, not shown) of each of the airflow restriction members $205_b'/206_b'$ serves to automatically move the airflow restriction members $205_b'/206_b'$ into their deployed positions as shown in FIG. 6b.

For instance, the airflow restriction member $205_b'$ may pivot downwardly (e.g., towards bottom portion 112 of framework 140) and away from the rear portion of the receiving bay $105_b$ into its deployed position while the airflow restriction member $206_b'$ may pivot upwardly (e.g., towards top portion 108 of framework 140) and away from the rear portion of the receiving bay $105_b$ into its deployed position. Collectively, the pair of airflow restriction members $205_b'/206_b'$ may be sized and configured to substantially fill the entire interior cross-sectional area of the receiving space of the receiving bay $105_b$ defined by the height dimension 164 and width dimension 160 (e.g., as shown in FIG. 4b) to limit airflow through the receiving space of the receiving bay $105_b$ to the front portion of the receiving bay $105_b$. Upon reinsertion of the FRU $102_b$ (or a different FRU) into the receiving space of the receiving bay $105_b$ via the front portion of the receiving bay $105_b$, continued urging of the FRU $102_b$ against the deployed airflow restriction members $205_b'/206_b'$ (e.g., via contact between a rear portion or protruding bracket of the FRU $102_b$ and front faces of the airflow restriction members $205_b'/206_b'$ with a force greater than that provided by the biasing members or gravity causes pivoting of the airflow restriction members $205_b'/206_b'$ about pivot axes $209_b'/210_b'$ back into their refracted positions. The system 200 of FIGS. 6a-6b may be advantageous for FRUs having smaller height form factors (e.g., less than a U) and/or for racks that maintain larger gaps between adjacent FRUs.

Figure 7A:
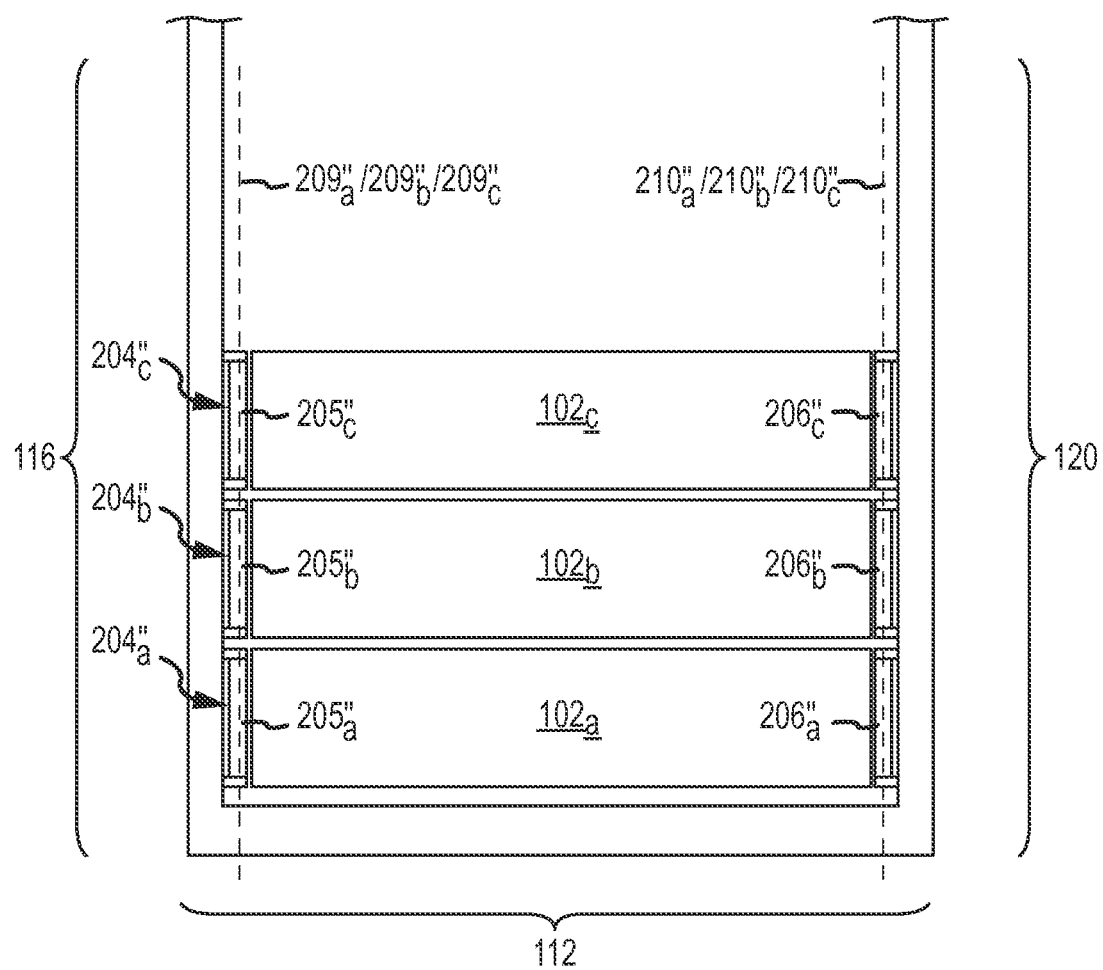
FIG. 7a is a front elevation view similar to that in FIG. 4a, but according to another embodiment.
Figure 7B:
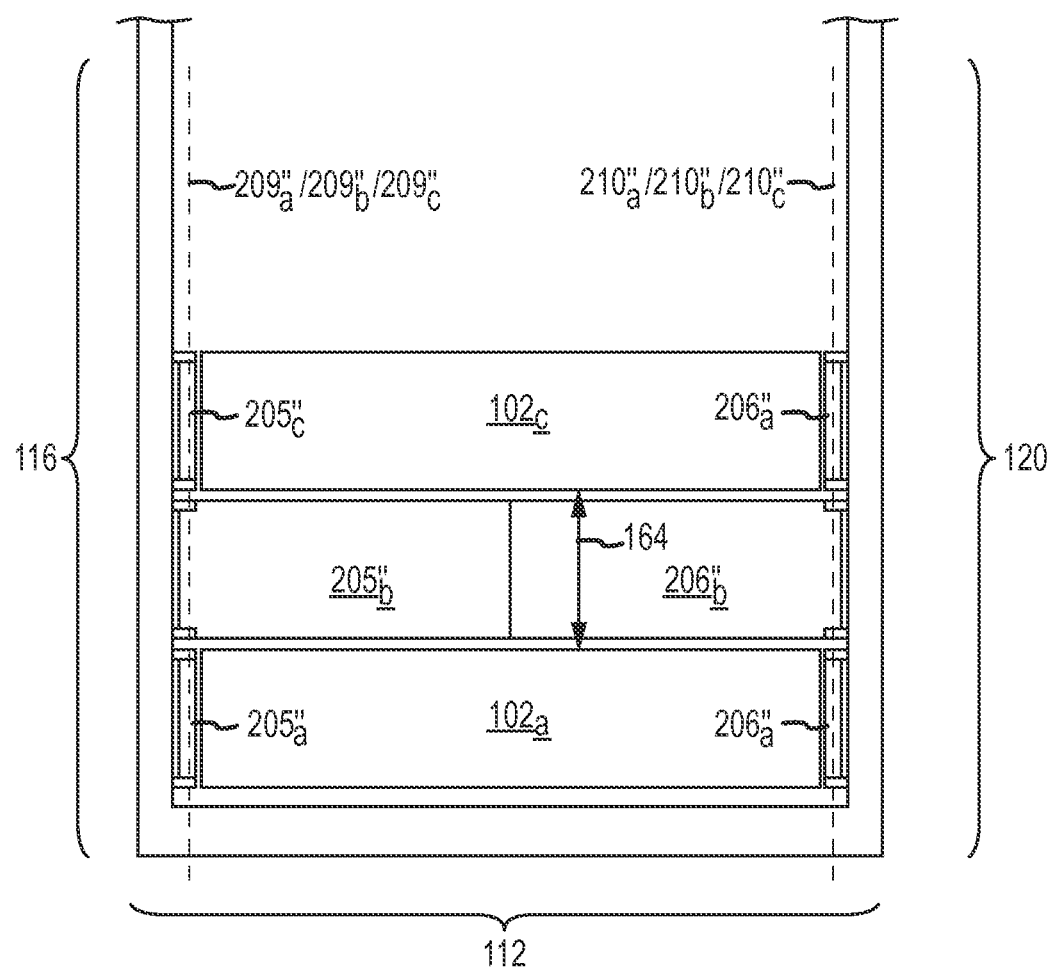

FIG. 7a illustrates a front elevation view similar to that in FIG. 4a, but according to another embodiment of the system 200. In this embodiment, each of the airflow restriction devices $204_a''$, $204_b''$, $204_c''$ includes an opposing pair of airflow restriction members $205_a''/206_a''$, $205_b''/206_b''$, $205_c''/206_c''$ respectively disposed on left and right side portions of the receiving bays $105_a$, $105_b$, $105_c$ and that are generally configured to move in horizontal directions towards and away from each other between retracted and deployed positions within the receiving space of the receiving bays $105_a$, $105_b$, $105_c$. The pairs of airflow restriction members $205_a''/206_a''$, $205_b''/206_b''$, $205_c''/206_c''$ may be pivotable about respective pivot axes $209_a''/210_a''$, $209_b''/210_b''$, $209_c''/210_c''$ extending in a general vertical direction between adjacent receiving bays (e.g., and which may be defined by any appropriate respective pivot members secured adjacent the third and forth side portions 116, 120 of the framework, such as to the vertical members 136 or to the rail assemblies) between refracted and deployed positions. As shown in FIG. 7a, each of the pairs of airflow restriction members $205_a''/206_a''$, $205_b''/206_b''$, $205_c''/206_c''$ may be disposed adjacent left and right side portions of the FRUs $102_a$, $102_b$, $102_c$ when in the refracted positions. Upon removal of one of the FRUs, such as FRU $102_b$, from the receiving space of its receiving bay $105_b$, a biasing force provided by a biasing member (e.g., a torsion spring similar to those discussed previously, not shown) of each of the airflow restriction members $205_b''/206_b''$ serves to automatically move the airflow restriction members $205_b''/206_b''$ into their deployed positions as shown in FIG. 7b.

For instance, the airflow restriction member $205_b''$ may pivot laterally (e.g., towards fourth side portion 120 of framework 140) and away from the rear portion of the receiving bay $105_b$ into its deployed position while the airflow restriction member $206_b''$ may pivot laterally (e.g., towards third side portion 116 of framework 140) and away from the rear portion of the receiving bay $105_b$ into its deployed position. Collectively, the pair of airflow restriction members $205_b''/206_b''$ may be sized and configured to substantially fill the entire interior cross-sectional area of the receiving space of the receiving bay $105_b$ defined by the width dimension 160 and height dimension 164 to limit airflow through the receiving space of the receiving bay $105_b$ to the front portion of the receiving bay $105_b$. Upon reinsertion of the FRU $102_b$ (or a different FRU) into the receiving space of the receiving bay $105_b$ via the front portion of the receiving bay $105_b$, continued urging of the FRU $102_b$ against the deployed airflow restriction members $205_b''/206_b''$ (e.g., via contact between a rear portion or protruding bracket of the FRU $102_b$ and front faces of the airflow restriction members $205_b''/206_b''$) with a force greater than that provided by the biasing members causes pivoting of the airflow restriction members $205_b''/206_b''$ about pivot axes $209_b''/210_b''$ back into their refracted positions. The system 200 of FIGS. 7a-7b may be advantageous for FRUs having smaller width form factors and/or for racks that maintain larger gaps between FRUs and the third and fourth side portions 116, 120 of the framework 140.

It will be readily appreciated and is to be understood that many additions to and/or deviations from the specific embodiments disclosed in the specification may be made without departing from the spirit and scope of the invention. For instance, the various airflow restriction devices 204/204'/204" may be disposed at numerous other locations other than those specifically shown in the drawings and described herein. As one example, and in situations in which space within each receiving bay 105 is at a premium, the airflow restriction devices 204/204'/204" may be disposed at the rear of the rack 100 adjacent the rear portions of the receiving bays 105. In this regard, the airflow restriction devices 204/204'/204" may cover the rear portions of (but not actually be disposed within) the receiving bays 105 in the deployed positions (so as to restrict airflow into the receiving spaces of the receiving bays 105 from outside of the receiving bays 105 via the rear portions of the receiving bays 105) and be entirely outside of the receiving bays 105 in the refracted positions. As another example, the restriction devices 204/204'/204" may be disposed at the front of the rack 100 adjacent the front portions of the receiving bays 105. In this regard, the airflow restriction devices 204/204'/204" may cover the front portions of (but not actually be disposed within) the receiving bays 105 in the deployed positions and be entirely inside of the receiving bays 105 in the refracted positions.

The system 200 may also encompass numerous different or even more complicated arrangements than those shown to manage airflow within a rack such as rack 100. In one arrangement, one or more of the receiving bays 105 may have more than one airflow restriction devices 204/204'/204" associated therewith to provide increasing levels of resistance to airflow therethrough in the absence of a FRU 102 therein. For instance, at least one of the receiving bays 105 could have a first airflow restriction device 204/204'/204" disposed within the receiving space of the receiving bay 105 and one or more additional airflow restriction devices 204/204'/204" disposed adjacent the front and/or rear portions of the receiving bay 105. In one variation, one or more of the receiving bays could have a first airflow restriction device 204/204' designed to swing vertically and a second airflow restriction device 204" design to swing horizontally.

In another arrangement, substantially direct contact between the FRU 102 (e.g., a rear portion of the FRU) and an airflow restriction device 204 may not be necessary to move the airflow restriction device 204 into the retracted position upon insertion of the FRU 102 into the rack 100. For instance, an actuator (e.g., lever, button, switch) that is interconnected to an airflow restriction device 204 in any appropriate manner (e.g., cables, links, etc.) may protrude into a receiving bay 105 (e.g., from a rail assembly, RETMA rail, etc.). In this regard, insertion of the FRU 102 into the receiving bay 105 may depress the actuator and thereby cause refraction of the airflow restriction device. This arrangement would allow the location of the actuator and the location of the airflow restriction device to be separated. For instance, depressing such an actuator adjacent the front portion of a particular receiving bay may cause automatic refraction of an airflow restriction device 204 disposed adjacent the rear portion of the receiving bay 105.

In one arrangement, depressing the actuator may electronically notify a monitoring program that a FRU has been removed from a receiving bay. Furthermore, the monitoring program could monitor successful deployment of the airflow restriction device 204 and/or whether or not rack airflow integrity has been compromised (e.g., via thermal sensors). Advantageously, the action of removing a FRU can simultaneously report that a FRU is out for service and confirm that the airflow of the frame has not been compromised.

It is to be understood that the number and/or configuration of airflow restriction devices 204/204'/204" of a particular airflow management system 200 may depend on a variety of factors such as FRU form factors, rack configuration, and/or the like. For instance, as racks 100 often have receiving bays 105 configured to accept FRUs of various form factors (e.g., 1 U, 2 U, etc.), the airflow restriction devices associated with the receiving bays 105 could also be appropriately sized (e.g., heights, widths, etc.) to block airflow through such receiving bays 105. Also, while the various airflow restriction devices 204/204'/204" disclosed herein have been discussed in the context of pivoting or swinging between the refracted and deployed positions, various other types of movements between the retracted and deployed positions are also envisioned and encompassed herein. For instance, in the case where an actuator is used to retract a particular airflow restriction device, the airflow restriction device may be configured to slide between the deployed and retracted positions.

It is also to be understood that the various numerical labels given to particular components or features herein (e.g., "first," "second," etc.) have merely been provided for the purposes of facilitating the reader's understanding of the present disclosure and do not necessarily limit features herein labeled as "first" from being a "second," or vice versa, and/or the like. Furthermore, the present system 200 need not necessarily be limited to racks or cabinets designed to store computing devices and the like in a number of bays in a stacked or side by side manner. That is, the present system 200 may be useful for limiting airflow through empty receiving bays whether or not such electronics/equipment happen to be in a stacked side by side arrangement.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment or arrangement can also be implemented in multiple embodiments or arrangements separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and/or parallel processing may be advantageous. Moreover, the separation of various system components in the embodiments described above should not be understood as requiring such separation in all embodiments, and it should be understood that the described program components and systems can generally be integrated together in a single software and/or hardware product or packaged into multiple software and/or hardware products.

The above described embodiments including the preferred embodiment and the best mode of the invention known to the inventor at the time of filing are given by illustrative examples only.

I claim:

1. A storage rack for supporting a plurality of field replaceable units (FRUs), comprising:
    a framework comprising a first end portion, an opposing second end portion, a plurality of side portions extending between the first and second end portions, and a storage area between the first end portion, the second end portion, and the plurality of side portions;
    a plurality of receiving bays disposed between the first and second end portions of the framework within the storage area, wherein each of the receiving bays comprises a front portion adjacent a first of the plurality of side portions of the framework, a rear portion adjacent an opposing second of the plurality of side portions of the framework, and a receiving space between the front and rear portions for receiving a FRU via the front portion; and
    a plurality of airflow restriction devices secured to the framework, wherein each of the airflow restriction devices is secured adjacent a respective one of the plurality of receiving bays, wherein each of the airflow restriction devices moves between at least a deployed position that restricts airflow through the receiving space of a respective receiving bay in the absence of a FRU in the receiving bay and a retracted position in the presence of a FRU in the receiving bay, and wherein each of the airflow restriction devices automatically moves to the retracted position during insertion of a FRU into the receiving space of a corresponding receiving bay via the front portion of the receiving bay;
    wherein the receiving space of each of the receiving bays comprises an interior cross-sectional area, wherein each of the airflow restriction devices is seized to substantially fill the interior cross-sectional area of the receiving space of a respective one of the receiving bays in the deployed position, wherein the interior cross-sectional area of the receiving space of each of the receiving bays comprises a width dimension extending between a third of the plurality of side portions of the framework and an opposing fourth of the plurality of side portions of the framework, and a height dimension extending substantially perpendicular to the width dimension;
    wherein the storage rack further comprise a plurality of pivot axes respectively extending along the width and/or height dimensions of the receiving spaces of the receiving bays, wherein each of the airflow restriction devices pivots about a respective one of the pivot axes between the deployed and retracted positions;
    wherein the storage rack further comprises a plurality of pivot members respectively defining the plurality of pivot axes and being attached to the framework adjacent the third and fourth side portions;
    wherein the framework further comprises a plurality of pairs of rail assemblies for receiving a respective plurality of FRUs in the plurality of receiving bays, wherein a first rail assembly of each of the pairs of rail assemblies extends between the first and second side portions adjacent the third side portion of the framework, wherein a second rail assembly of each of the pairs of rail assembly extends between the first and second side portions adjacent the fourth side portion of the framework, and wherein the plurality of pivot members are respectively attached to the plurality of pairs of rail assemblies.

2. The storage rack of claim 1, wherein each of the airflow restriction devices substantially fills the interior cross-sectional area of the receiving space of a respective one of the receiving bays in the deployed position.

3. The storage rack of claim 1, wherein each of the airflow restriction devices swings away from the front portion of a respective receiving bay into the retracted position as a respective FRU is inserted into the receiving space of the receiving bay via the front portion, and wherein each of the airflow restriction devices swings towards the front portion of a respective receiving bay into the deployed position as a respective FRU is removed from the receiving space of the receiving bay via the front portion.

4. The storage rack of claim 1, further comprising a plurality of spring members that respectively bias the plurality of airflow restriction devices into the deployed positions, wherein insertion of a FRU into the receiving space of a respective receiving bay overcomes a biasing force of a respective spring member to move the airflow restriction device into the retracted position.

5. The storage rack of claim 1, wherein each of the airflow restriction devices automatically moves to the deployed position in the absence of a FRU in the receiving space of a corresponding receiving bay.

6. The storage rack of claim 1, wherein at least some of the airflow restriction devices are disposed adjacent the rear portion of the respective receiving bays.

7. A system, comprising:

a computing cabinet comprising a framework including a first end portion, an opposing second end portion, a plurality of side portions extending between the first and second end portions, and an interior storage area between the first end portion, the second end portion, and the plurality of side portions that defines a plurality of stacked receiving bays each receiving a computing device, wherein each of the receiving bays comprises a front portion adjacent a first of the plurality of side portions of the framework, and a receiving space between the front a rear portions for receiving a computing device via the front portion, wherein an interior cross-sectional area of the receiving space of each of the receiving bays includes a width dimension extending between a third of the plurality of side portions of the framework and an opposing fourth of the plurality of side portions of the framework, wherein the interior cross-sectional area of the receiving space of each of the receiving bays includes a height dimension extending between the first and second end portions of the framework, and wherein each of the third and fourth side portions of the framework includes at least one vertical support member disposed between the vertical support members of the first and second side portions; and an airflow management subsystem that restricts airflow circulation into the receiving bays in the absence of a computing device received within one of the receiving bays, wherein the airflow management subsystem comprises a plurality of airflow circulation restriction baffles movably secured to the cabinet adjacent respective ones of the receiving bays, and wherein each of the airflow circulation restriction baffles is movable between a deployed position that restricts airflow through a respective one of the receiving bays between opposed front and rear ends of the receiving bay in response to removal of a computing device from the receiving bay and a storage position that permits mounting of a computing device within the receiving bay in response to insertion of a computing device into the receiving bay;

wherein the system further comprises a plurality of pivot axes respectively extending along the width and/or height dimensions of the receiving spaces of the receiving bays, wherein each of the airflow circulation restriction baffles pivots about a respective one of the pivot axes between the deployed and storage positions; and wherein the system further comprises a plurality of pivot members respectively defining the plurality of pivot axes and being attached to the vertical support members of the third and fourth side portions that are disposed between the vertical support members of the first and second side portions.

8. The system of claim 7, wherein the airflow management subsystem further comprises a plurality of spring members that respectively bias the plurality of airflow circulation restriction baffles into the deployed positions in the absence of an overcoming force applied by respective computing devices.

9. The system of claim 7, wherein each of the airflow recirculation restriction baffles is sized to substantially fill an interior cross-sectional area of a respective one of the receiving bays in the deployed position.

10. The system of claim 7, wherein the plurality of pivot axes respectively extend along the width dimension of the receiving spaces of the receiving bays.

11. The system of claim 7, wherein the plurality of pivot axes respectively extend along the height dimension of the receiving spaces of the receiving bays.

* * * * *

UNITED STATES PATENT AND TRADEMARK OFFICE
CERTIFICATE OF CORRECTION

| | | |
|---|---|---|
| PATENT NO. | : 8,982,554 B2 | Page 1 of 1 |
| APPLICATION NO. | : 13/727428 | |
| DATED | : March 17, 2015 | |
| INVENTOR(S) | : Thomas E. Stewart | |

It is certified that error appears in the above-identified patent and that said Letters Patent is hereby corrected as shown below:

In the Claims,

Column 14
Line 24, delete "seized" and insert therefor --sized--.

Signed and Sealed this
Thirtieth Day of June, 2015

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,982,554 B2 | Page 1 of 2 |
| APPLICATION NO. | : 13/727428 | |
| DATED | : March 17, 2015 | |
| INVENTOR(S) | : Stewart | |

It is certified that error appears in the above-identified patent and that said Letters Patent is hereby corrected as shown below:

On the title page item (74), column 2, under Attorney, Agent or Firm, line 2, delete "Szummy" and insert -- Szumny --, therefor.

On the title page item (57), column 2, under Abstract, line 12, delete "refracted" and insert -- retracted --, therefor.

In the specification,

In column 1, line 53, delete "refracted" and insert -- retracted --, therefor.

In column 1, line 57, delete "refracted" and insert -- retracted --, therefor.

In column 4, line 1, delete "refracting," and insert -- retracting, --, therefor.

In column 4, line 11, delete "refraction" and insert -- retraction --, therefor.

In column 4, line 47, delete "refracted" and insert -- retracted --, therefor.

In column 8, line 6, delete "refracted" and insert -- retracted --, therefor.

In column 10, line 32, delete "refracted" and insert -- retracted --, therefor.

In column 10, line 66, delete "refracted" and insert -- retracted --, therefor.

In column 11, line 21, delete "refracted" and insert -- retracted --, therefor.

In column 11, line 25, delete "refracted" and insert -- retracted --, therefor.

In column 11, line 55, delete "refracted" and insert -- retracted --, therefor.

Signed and Sealed this
Twenty-second Day of March, 2016

Michelle K. Lee
*Director of the United States Patent and Trademark Office*

CERTIFICATE OF CORRECTION (continued)
U.S. Pat. No. 8,982,554 B2

In column 12, line 10, delete "refracted" and insert -- retracted --, therefor.

In column 12, line 17, delete "refracted" and insert -- retracted --, therefor.

In column 12, line 44, delete "refraction" and insert -- retraction --, therefor.

In column 12, line 49, delete "refraction" and insert -- retraction --, therefor.

In column 13, line 5, delete "refracted" and insert -- retracted --, therefor.

In column 13, line 7, delete "refracted" and insert -- retracted --, therefor.

In the claims,

In column 15, line 25, in claim 7, after "framework," insert -- a rear portion adjacent an opposing second of the plurality of side portions of the framework, --.

In column 15, line 34, in claim 7, after "extending" insert -- substantially perpendicular to the width dimension, wherein each of the first and second side portions of the framework includes a plurality of vertical support members extending --.